US009496281B2

(12) United States Patent
Doris et al.

(10) Patent No.: US 9,496,281 B2
(45) Date of Patent: Nov. 15, 2016

(54) DUAL ISOLATION ON SSOI WAFER

(71) Applicant: International Business Machines Corporation, Armonk, NY (US)

(72) Inventors: Bruce B. Doris, Slingerlands, NY (US); Hong He, Schenectady, NY (US); Ali Khakifirooz, Los Altos, CA (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/082,199

(22) Filed: Mar. 28, 2016

(65) Prior Publication Data

US 2016/0233243 A1 Aug. 11, 2016

Related U.S. Application Data

(62) Division of application No. 14/618,442, filed on Feb. 10, 2015, now Pat. No. 9,401,372.

(51) Int. Cl.
*H01L 21/00* (2006.01)
*H01L 27/12* (2006.01)
*H01L 27/092* (2006.01)
(Continued)

(52) U.S. Cl.
CPC ....... *H01L 27/1207* (2013.01); *H01L 27/0924* (2013.01); *H01L 29/0653* (2013.01); *H01L 29/1054* (2013.01); *H01L 29/161* (2013.01); *H01L 29/165* (2013.01); *H01L 21/0276* (2013.01); *H01L 21/02532* (2013.01); *H01L 21/30604* (2013.01); *H01L 21/31055* (2013.01); *H01L 21/31111* (2013.01); *H01L 21/8238* (2013.01); *H01L 21/845* (2013.01); *H01L 27/1211* (2013.01); *H01L 29/66795* (2013.01)

(58) Field of Classification Search
CPC ............. H01L 21/845; H01L 21/8238; H01L 27/1211; H01L 29/66795
See application file for complete search history.

(56) References Cited

U.S. PATENT DOCUMENTS 8,841,178 B1 * 9/2014 Basker ................ H01L 29/1054
257/220
8,993,399 B2 * 3/2015 Cheng ............... H01L 21/76224
438/268

(Continued)

OTHER PUBLICATIONS

List of IBM Patents or Patent Applications Treated as Related; (Appendix P), Filed Mar. 28, 2016; 2 pages.

(Continued)

*Primary Examiner* — Nicholas Tobergte
(74) *Attorney, Agent, or Firm* — Cantor Colburn LLP; Vazken Alexanian

(57) ABSTRACT

A method of forming fins in a dual isolation complimentary-metal-oxide-semiconductor (CMOS) device that includes a p-type field effect transistor device (pFET) and an n-type field effect transistor (nFET) device and a CMOS device with dual isolation are described. The CMOS device includes an n-type field effect transistor (nFET) region, the nFET region including one or more fins comprised of strained silicon, the one or fins in the nFET region being formed on an insulator. The CMOS device also includes a p-type field effect transistor (pFET) region, the pFET region including one or more fins comprised of silicon (Si) or silicon germanium (SiGe) on epitaxially grown silicon and including a shallow trench isolation (STI) fill to isolate the one or more fins of the pFET region from each other.

16 Claims, 22 Drawing Sheets

(51) Int. Cl.
   *H01L 29/10*     (2006.01)
   *H01L 29/161*    (2006.01)
   *H01L 29/165*    (2006.01)
   *H01L 29/06*     (2006.01)
   H01L 21/027     (2006.01)
   H01L 21/02      (2006.01)
   H01L 21/3105    (2006.01)
   H01L 21/311     (2006.01)
   H01L 21/306     (2006.01)
   H01L 21/8238    (2006.01)
   H01L 29/66      (2006.01)
   H01L 21/84      (2006.01)

(56) References Cited

U.S. PATENT DOCUMENTS

| | | | | | |
|---|---|---|---|---|---|
| 2006/0011984 | A1* | 1/2006 | Currie | H01L 21/76254 | 257/352 |
| 2006/0097316 | A1* | 5/2006 | Chen | H01L 21/76283 | 257/347 |
| 2007/0096201 | A1* | 5/2007 | Ning | H01L 21/823807 | 257/321 |
| 2011/0180847 | A1* | 7/2011 | Ikeda | H01L 29/045 | 257/190 |
| 2013/0252349 | A1* | 9/2013 | Pradhan | H01L 21/26513 | 438/4 |
| 2014/0008730 | A1* | 1/2014 | Mitard | H01L 27/092 | 257/369 |
| 2014/0151806 | A1* | 6/2014 | Basker | H01L 29/66795 | 257/347 |
| 2014/0197377 | A1* | 7/2014 | Kim | H01L 27/092 | 257/29 |
| 2014/0349460 | A1* | 11/2014 | Vinet | H01L 21/225 | 438/303 |
| 2015/0017781 | A1* | 1/2015 | Lin | H01L 21/76224 | 438/424 |
| 2015/0243755 | A1* | 8/2015 | Cheng | H01L 21/3086 | 257/288 |

OTHER PUBLICATIONS

Bruce B. Doris et al., "Dual Isolation on SSOI Wafer", U.S. Appl. No. 14/618,442, filed Feb. 10, 2015.

Bruce B. Doris et al., "Replacement Fin Process in SSOI Wafer", U.S. Appl. No. 14/609,574, filed Jan. 30, 2015.

Bruce B. Doris et al., "Replacement Fin Process in SSOI Wafer", U.S. Appl. No. 15/082,161, filed Mar. 28, 2016.

Bruce B. Doris et al., "CMOS Structure on SSOI Wafer", U.S. Appl. No. 14/618,397, filed Feb. 10, 2015.

Bruce B. Doris et al., "CMOS Structure on SSOI Wafer", U.S. Appl. No. 15/082,180, filed Mar. 28, 2016.

* cited by examiner

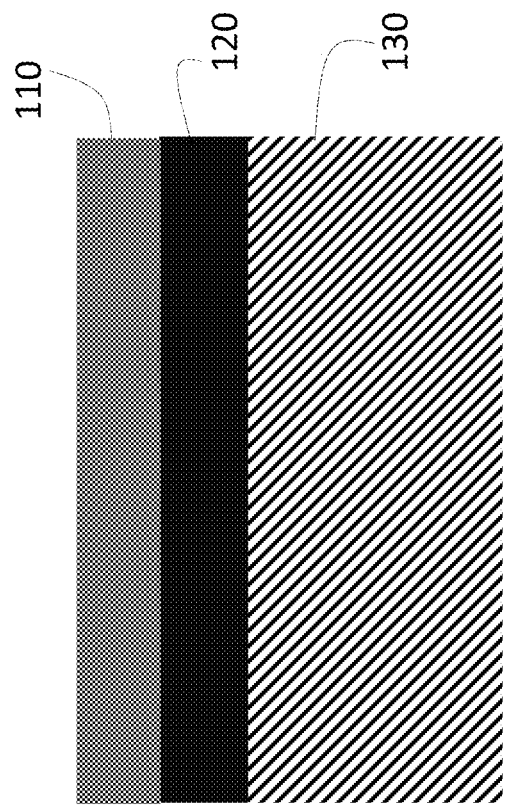
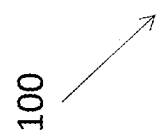
FIG. 1

DUAL ISOLATION ON SSOI WAFER

This application is a division of U.S. application Ser. No. 14/618,442 filed Feb. 10, 2015, the disclosure of which is incorporated by reference herein in its entirety.

BACKGROUND

The present invention relates to a complementary-metal-oxide-semiconductor (CMOS), and more specifically, to dual isolation on a strained silicon-on-insulator (SSOI) wafer.

A fin field effect transistor (finFET) is a type of metal-oxide-semiconductor FET (MOSFET) in which a conducting channel is wrapped by a silicon fin. A finFET device may be a complementary metal-oxide-semiconductor (CMOS) device that includes a p-type metal-oxide-semiconductor (pMOS) finFET device or pFET and an n-type metal-oxide-semiconductor (NMOS) finFET device or nFET formed on a substrate. A silicon-on-insulator (SOI) wafer includes a substrate with a silicon layer having a neutral silicon lattice. When the silicon lattice is bigger than a neutral silicon lattice, the silicon is said to be under tensile strain. This is typically the strain experienced in an SSOI wafer. When the silicon lattice is smaller than a neutral silicon lattice, the silicon is said to be under compressive strain. As noted, a finFET (e.g., CMOS device) may include an n-channel region (nFET) and a p-channel region (pFET) with silicon (Si) and silicon germanium (SiGe) fins, respectively. While an SSOI substrate may improve performance in the nFET, the tensile strained SSOI substrate may cause mobility degradation in the pFET channel region.

SUMMARY

According to one embodiment of the present invention, a method of forming fins in a dual isolation complimentary-metal-oxide-semiconductor (CMOS) device that includes a p-type field effect transistor device (pFET) and an n-type field effect transistor (nFET) device includes forming a strained silicon-on-insulator (SSOI) layer in both a pFET region and an nFET region, the SSOI layer including a strained silicon layer disposed on an insulator that is disposed on a bulk substrate; etching the strained silicon layer, the insulator, and a portion of the bulk substrate in only the pFET region to expose the bulk substrate; epitaxially growing silicon (Si) from the bulk substrate in only the pFET region; epitaxially growing additional semiconductor material on the Si in only the pFET region; forming one or more fins from the additional semiconductor material and a portion of the Si grown on the bulk substrate in the pFET region; forming one or more fins from the strained silicon layer on the insulator in the nFET region; and performing a shallow trench isolation (STI) fill in the pFET region to isolate the one or more fins in the pFET region from each other.

According to another embodiment, a complimentary-metal-oxide-semiconductor (CMOS) device with dual isolation includes an n-type field effect transistor (nFET) region, the nFET region including one or more fins comprised of strained silicon, the one or fins in the nFET region being formed on an insulator; and a p-type field effect transistor (pFET) region, the pFET region including one or more fins comprised of silicon (Si) or silicon germanium (SiGe) on epitaxially grown silicon and including a shallow trench isolation (STI) fill to isolate the one or more fins of the pFET region from each other.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-13 show cross-sectional views of intermediate structures involved in processes to form Si fins on an insulator in the nFET region and SiGe fins on silicon in the pFET region that exhibit dual isolation according to an embodiment of the invention, in which:

FIG. 1 shows a starting SSOI wafer prior to formation of any fins by the present embodiment;

FIG. 2 shows the intermediate structure resulting from deposition of a hard mask layer, an under layer, and a patterned photoresist layer on the SSOI wafer of FIG. 1;

FIG. 3 shows the intermediate structure that results from etching through the layers including a portion of the substrate in the pFET region;

FIG. 4 shows the intermediate structure that results from epitaxial growth of silicon from the substrate and subsequent epitaxial growth of an SiGe layer in the pFET region;

FIG. 5 shows the intermediate structure that results from stripping the hard mask layer from the nFET region of the structure shown in FIG. 4;

FIG. 6 shows the intermediate structure that results from deposition of the hard mask layer in both the pFET and nFET regions;

FIG. 7 shows the intermediate structure that results from deposition of a mandrel layer and a patterned lithographic mask over the hard mask layer;

FIG. 8 shows the intermediate structure that results from patterning the mandrel layer using the patterned lithographic mask and deposing a spacer material over the patterned mandrel layer;

FIG. 9 shows the intermediate structure that results from an etch of the horizontally deposited portions of the spacer material;

FIG. 10 shows the intermediate structure that results from pulling the patterned mandrel layer from the structure shown in FIG. 9, leaving spacers;

FIG. 11 shows the intermediate structure resulting from etching fins in the pFET region and the nFET region using the spacers;

FIG. 12 shows the intermediate structure resulting from deposition of STI fill; and FIG. 13 shows the structure resulting from etching back the STI and stripping off the hard mask;

FIGS. 14-22 show cross-sectional views of intermediate structures involved in processes to form Si fins on an insulator in the nFET region and SiGe fins on silicon in the pFET region that exhibit dual isolation according to another embodiment of the invention, in which:

FIG. 14 shows a starting SSOI wafer prior to formation of any fins by the present embodiment;

FIG. 15 shows the intermediate structure resulting from deposition of a hard mask layer, an under layer, and a patterned photoresist layer on the SSOI wafer of FIG. 14;

FIG. 16 shows the intermediate structure that results from etching through the layers including a portion of the substrate in the pFET region;

FIG. 17 shows the intermediate structure that results from epitaxial growth of silicon from the substrate and subsequent epitaxial growth of an SiGe layer in the pFET region;

FIG. 18 shows the intermediate structure that results from stripping the hard mask layer from the nFET region of the structure shown in FIG. 17;

FIG. 19 shows the intermediate structure that results from deposition of the hard mask layer in both the pFET and nFET regions;

FIG. 20 shows the intermediate structure resulting from etching fins in the pFET region and the nFET region;

FIG. 21 shows the intermediate structure resulting from deposition of an STI fill; and FIG. 22 shows the structure resulting from etching back the STI and stripping off the hard mask.

DETAILED DESCRIPTION

As noted above, an SSOI wafer or a wafer that includes strained silicon (typically tensile strained silicon) may prove advantageous for an nFET device but degrade performance in the pFET channel region. Embodiments of the systems and methods detailed herein relate to the release of pFET channel strain while maintaining (tensile) strained SOI in the nFET region. Further, the embodiments detailed herein exhibit dual isolation such that the nFET and pFET regions are isolated from each other and fins within each of the pFET region and nFET region are isolated from each other.

FIGS. 1-13 illustrate the processes involved in forming Si fins from (tensile) strained silicon on an insulator in the nFET region and forming SiGe fins on Si in the pFET region according to one embodiment. FIG. 1 is a cross-sectional view of an SSOI wafer 100 used to define a PFET region and an nFET region according to the embodiment detailed below. The SSOI wafer 100 includes a strained silicon layer 110 on an insulator 120 (e.g., buried oxide (BOX)). The SSOI wafer 100 may be obtained through known fabrication methods that include, for example, growing a gradient SiGe layer on an Si wafer to form a relaxed SiGe layer, and epitaxially growing an Si layer above the SiGe layer. Because the relaxed SiGe has a larger lattice than Si crystal (neutral), the epitaxially grown Si layer will be tensile strained. Another Si wafer and with OX (as buried oxide) may be formed and then bonded with the strained Si/SiGe/Si substrate wafer on the BOX (via a wafer bonding technique, for example). Hydrogen (H+ ion) implantation may then be used to cut the SiGe and Si substrate off through a smart-cut technique, for example, and any remaining SiGe layer on strained Si may be etched off to form the SSOI wafer 100. The insulator 120 is formed on a bulk substrate 130.

Figure 2:
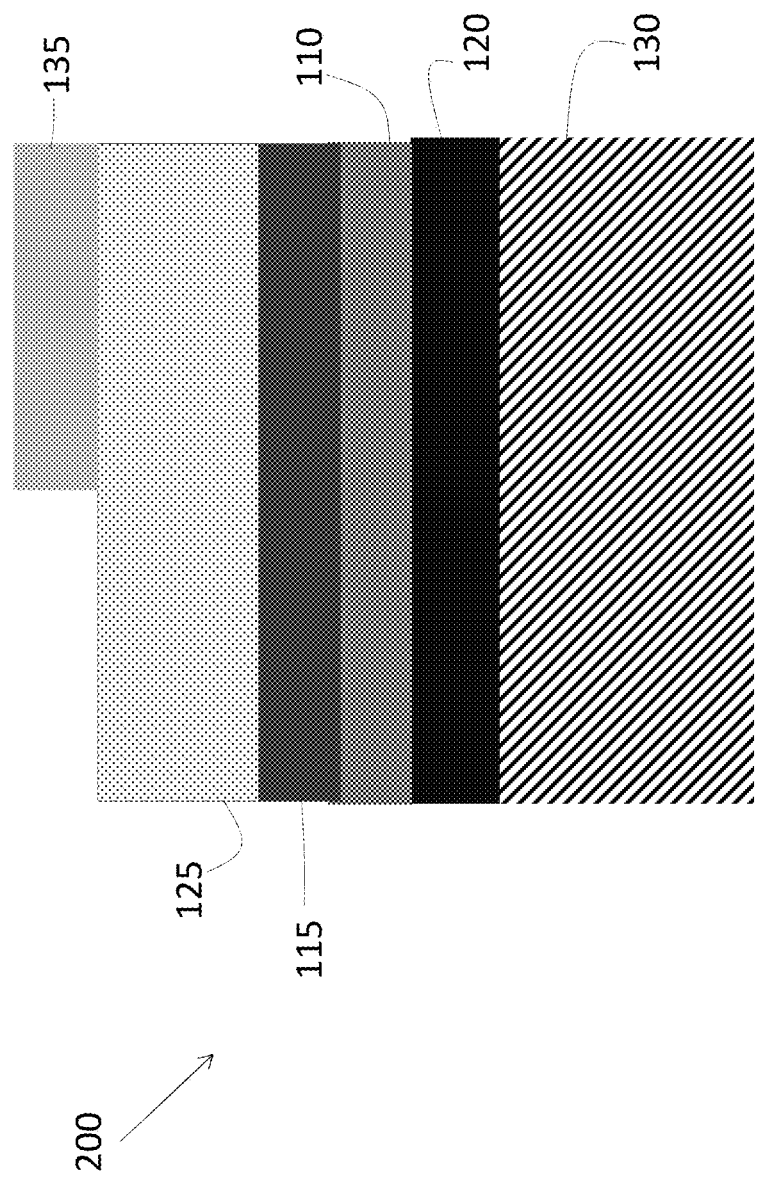
Figure 3:
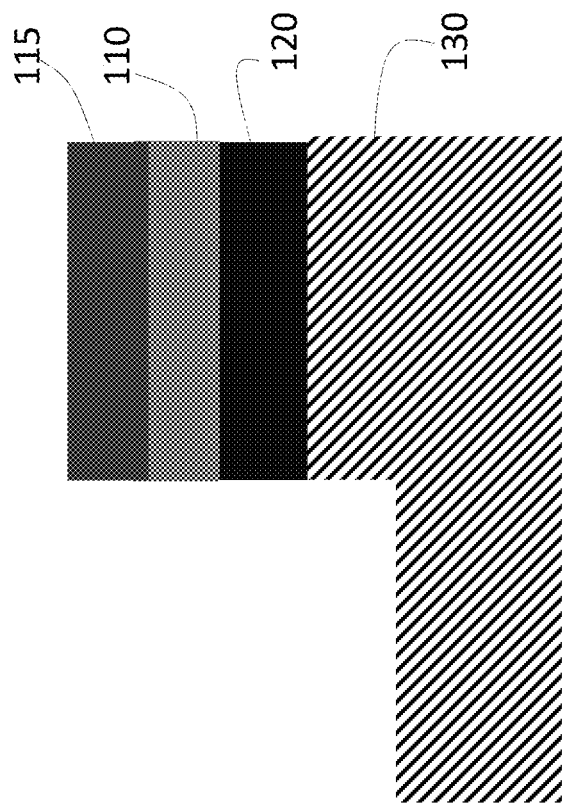

FIG. 2 shows the intermediate structure 200 that results from depositing a hard mask layer 115 on the strained silicon layer 110 of the SSOI wafer 100 followed by deposition of an under layer 125 and a patterned photoresist layer 135. The hard mask layer 115 may be comprised of silicon nitride (SiN) for example. The under layer 125 may include an organic dielectric layer (ODL) and a silicon-containing antireflection coating (SiARC). The photoresist layer 135 is patterned to cover the under layer 125 in the nFET region 102 while leaving the under layer 125 exposed in the pFET region 101. FIG. 3 shows the intermediate structure 300 that results from a subsequent etch of the structure 200 shown in FIG. 2. The under layer 125 and photoresist layer 135 are etched through in the nFET region 102. Based on the patterning of the photoresist layer 135 and by selectively controlling a depth of the etching process, the exposed area (the pFET region 101) is etched through all the layers, leaving only a portion of the substrate 130. The SSOI wafer 100 and hard mask layer 115 remain intact in the nFET region 102.

Figure 4:
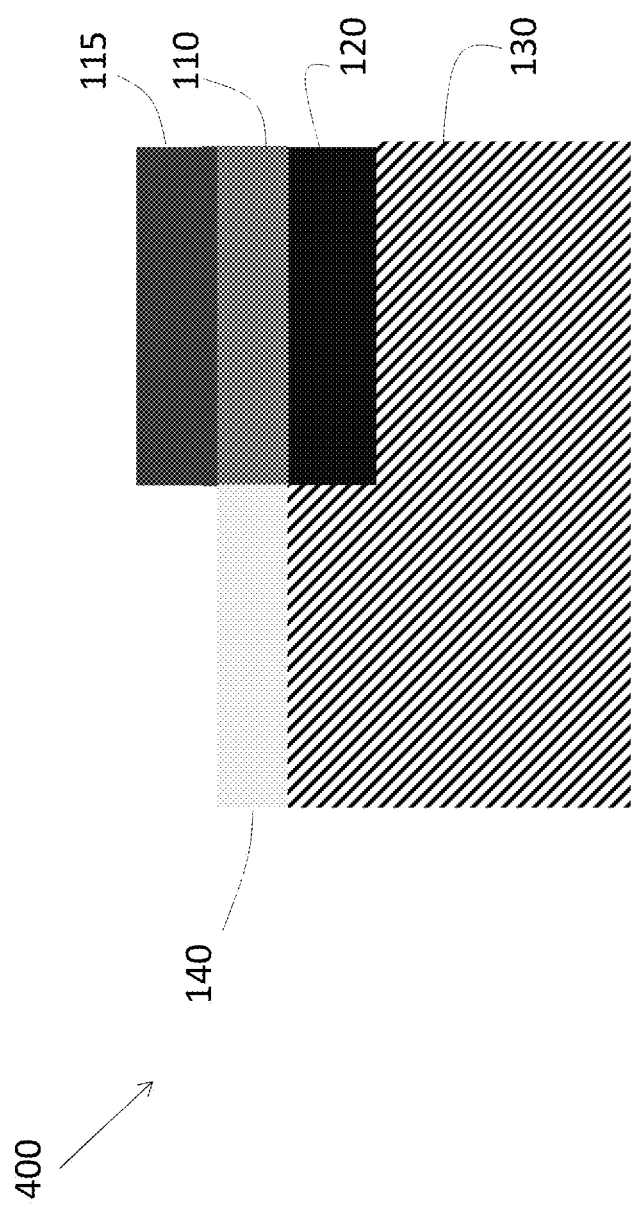
Figure 5:
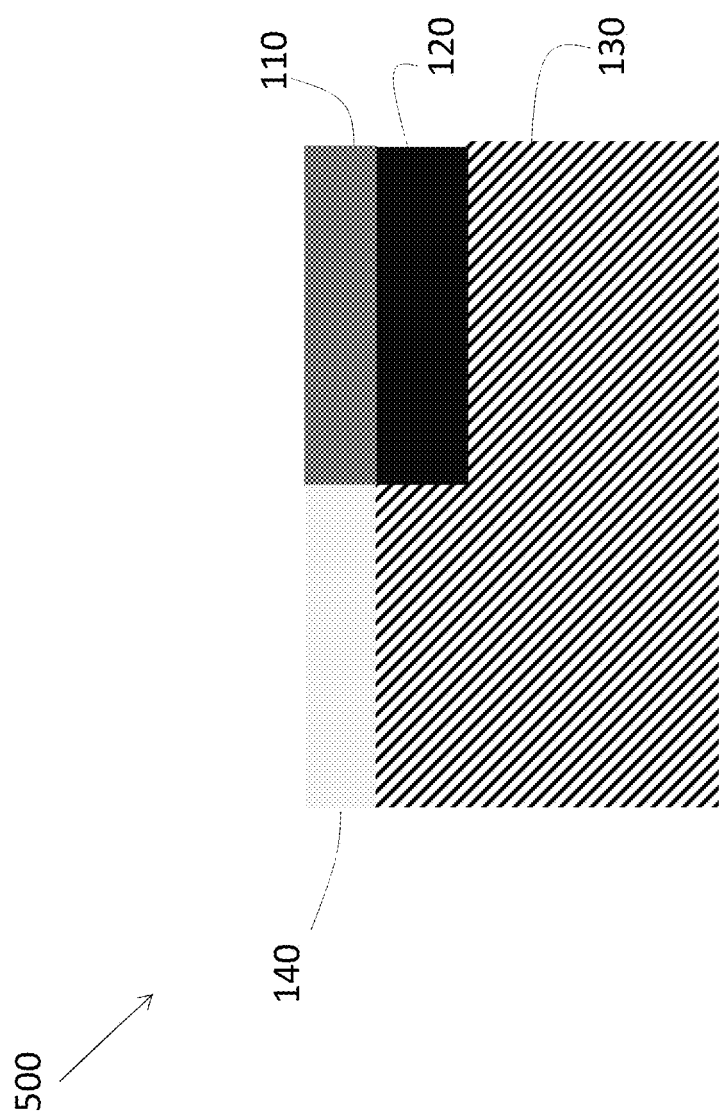
Figure 6:
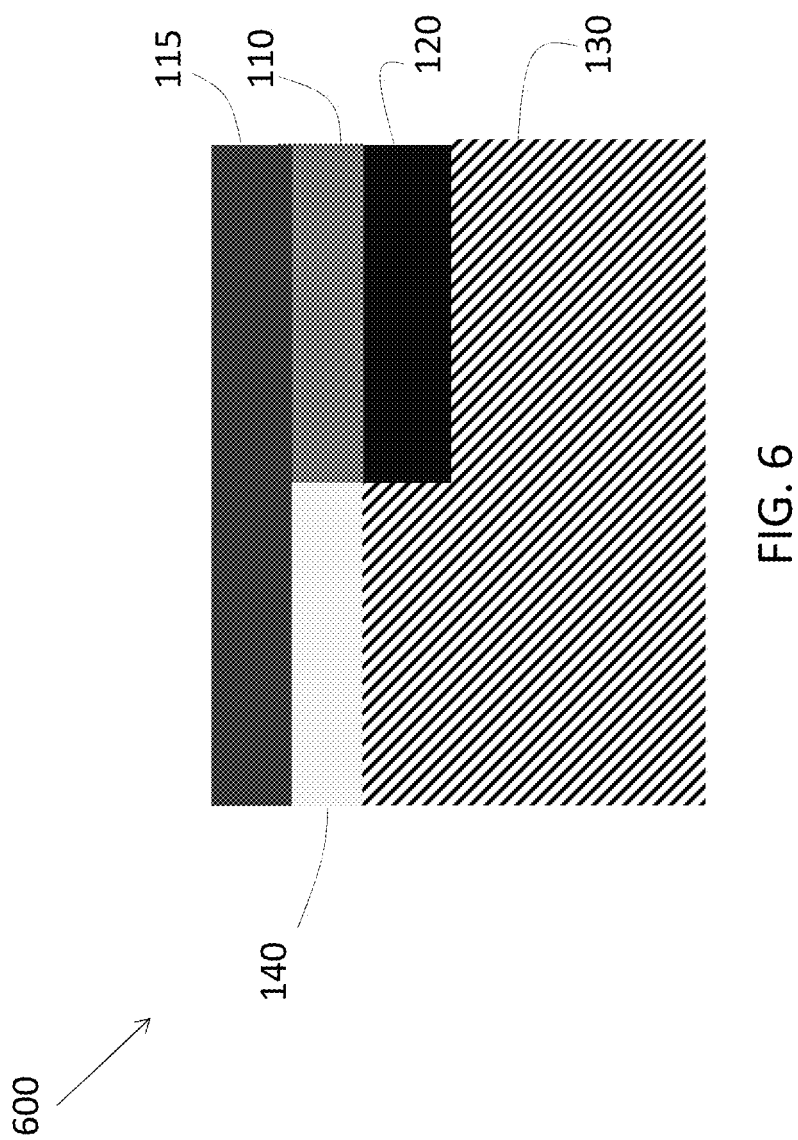
Figure 7:
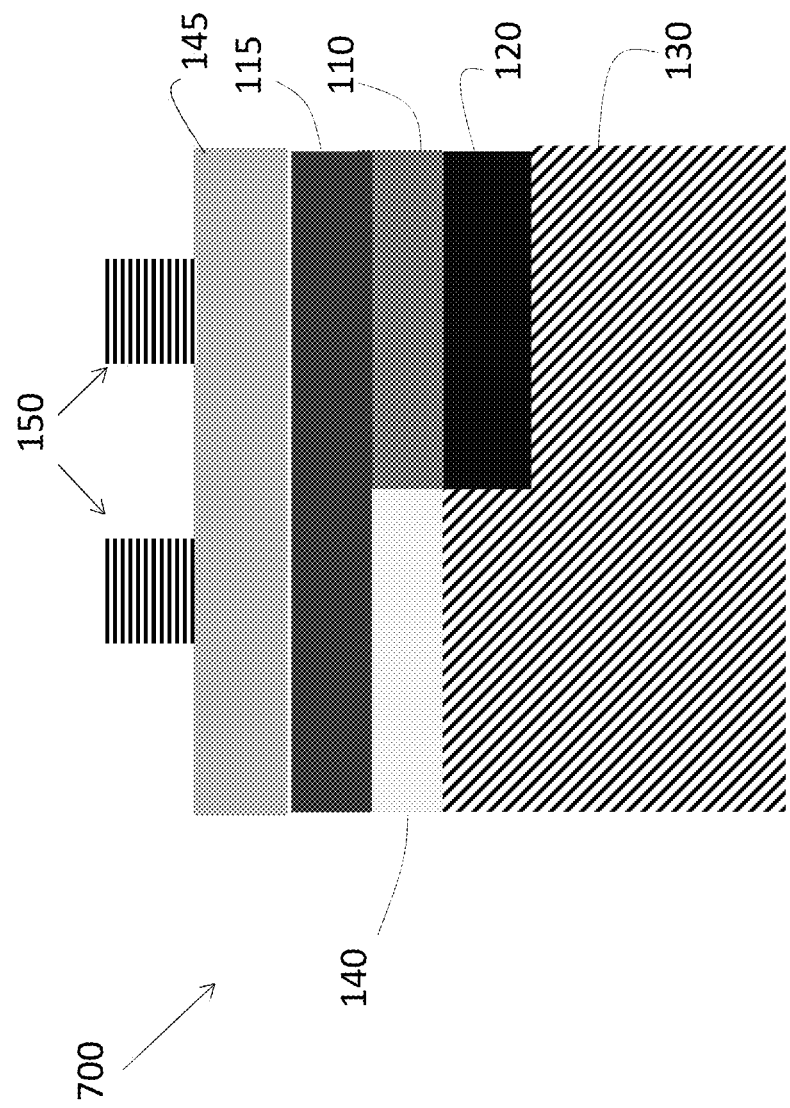

FIG. 4 shows the intermediate structure 400 resulting from epitaxial growth of silicon (130) and a silicon germanium (SiGe) layer 140 over the remaining substrate 130 in the pFET region 101. Epitaxial growth of the silicon begins from the substrate 130, as shown. The SiGe layer 140 is then epitaxially grown on the epitaxially grown Si 130. Alternately, additional Si rather than the SiGe layer 140 may be epitaxially grown to form Si fins in the pFET region 101 as well as in the nFET region 102. However, the epitaxially grown silicon in the pFET region would have no strain (resulting in neutral fins in the pFET region 101). The SiGe layer 140 may be neutral or have compressive strain. The epitaxial growth of Si from the substrate 130 is controlled to be about the same height as the insulator 120. The subsequent epitaxial growth of the SiGe layer 140 (or additional Si) is controlled such that the additional Si or SiGe layer 140 is about the same height as the strained silicon layer 110 in the nFET region 102. The hard mask layer 115 is stripped from the nFET region 102 to result in the intermediate structure 500 shown in FIG. 5. FIG. 6 shows the intermediate structure 600 that results from deposition of another hard mask layer 115 over both the pFET region 101 and the nFET region 102.

Figure 8:
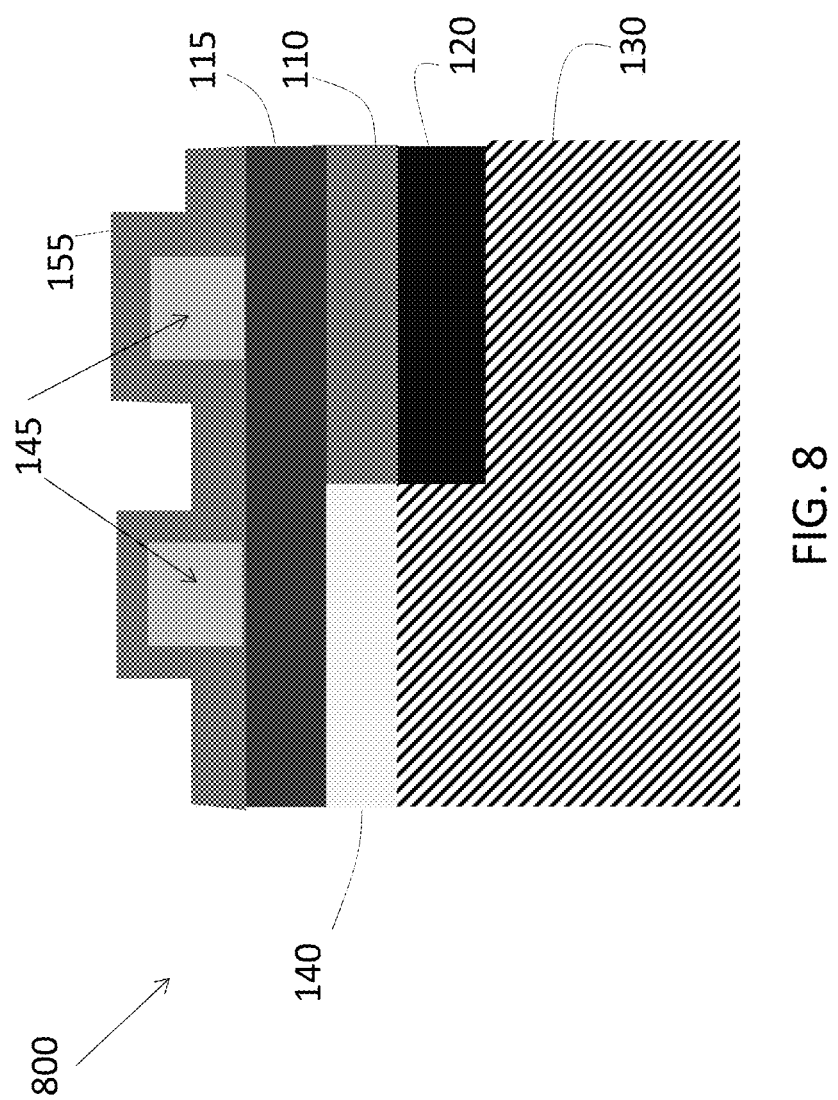
Figure 9:
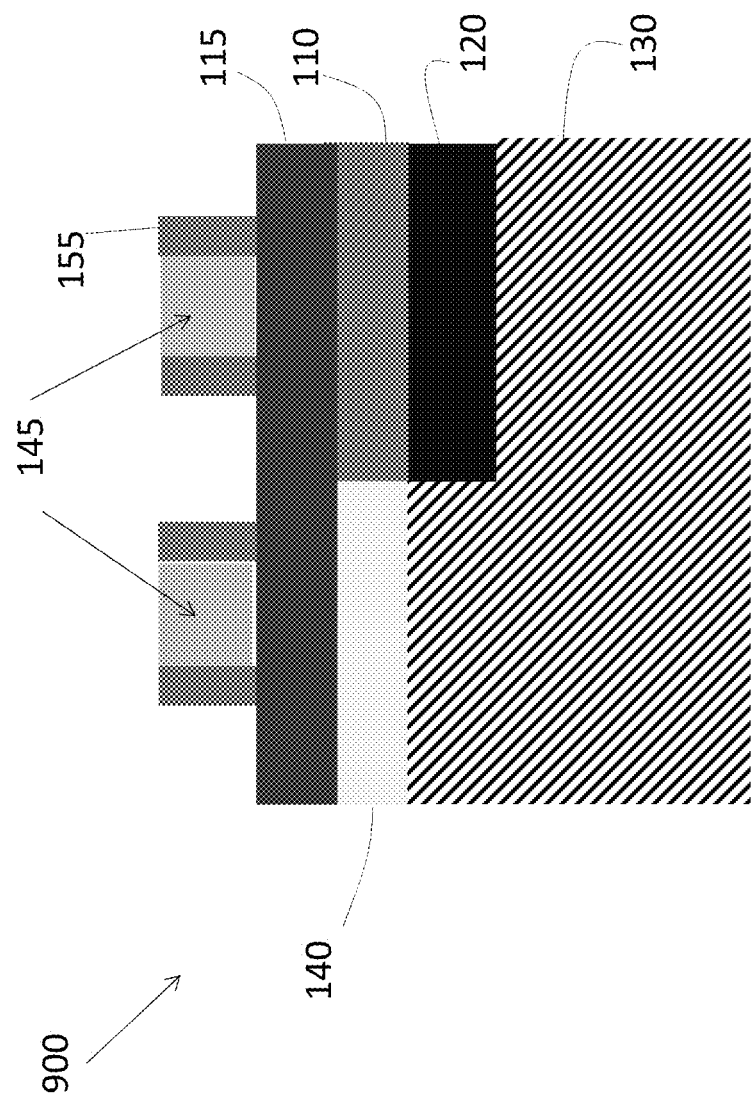
Figure 10:
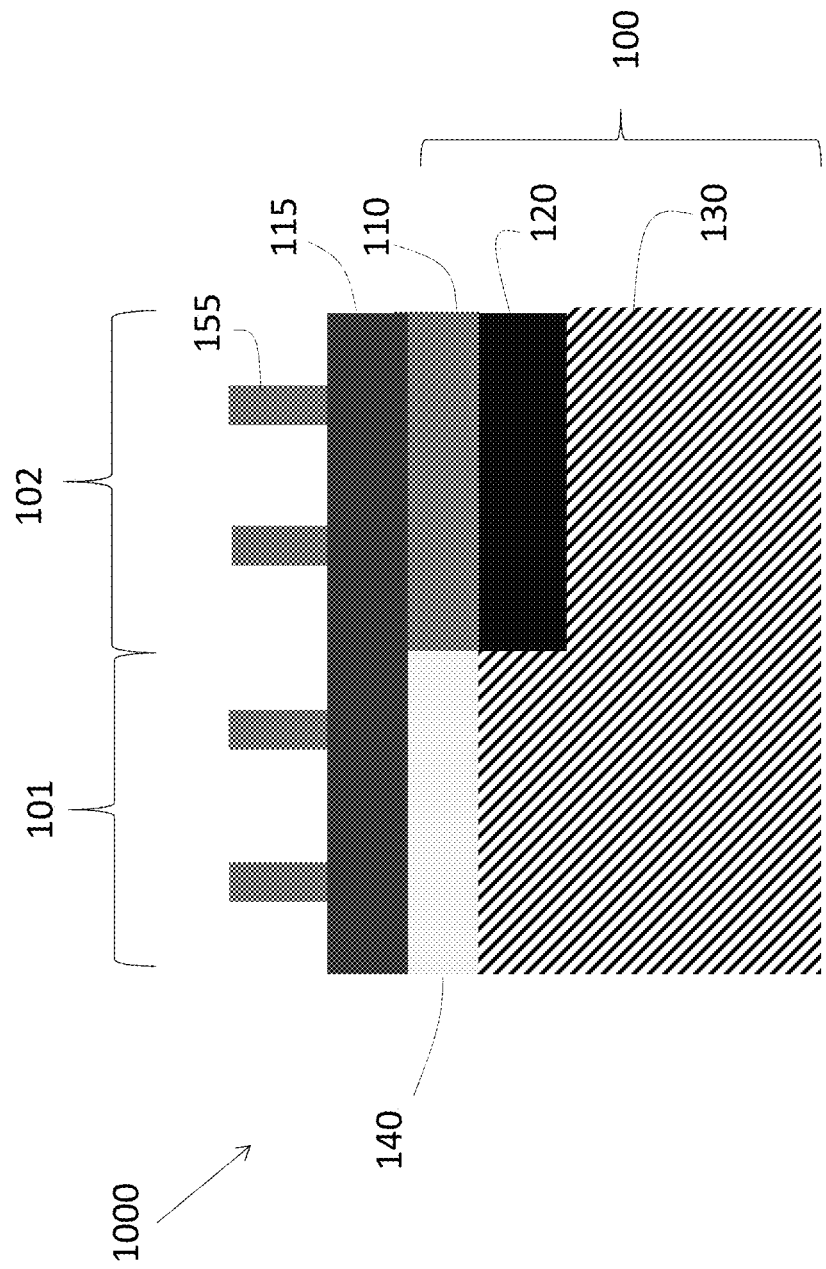

FIGS. 7-11 show some of the processes involved in forming fins in the pFET region 101 and nFET region 102. The intermediate structure 700 shown in FIG. 7 includes a mandrel layer 145 deposited on the hard mask layer 115 and a lithographic mask 150 patterned over the mandrel layer 145. The mandrel layer 145 may be amorphous carbon or amorphous silicon, for example. The lithographic mask 150 may be comprised of SiARC, an optical planarization layer, and a photoresist layer, for example. FIG. 8 shows the intermediate structure 800 that results from patterning the mandrel layer 145 using the lithographic mask 150 and then depositing a spacer material 155 over the patterned mandrel layer 145. FIG. 9 shows the structure 900 that results from an anisotropic (directional) reactive ion etch (RIE) process to etch the horizontally disposed portions of the spacer material 155 shown in the structure 800 of FIG. 8 into sidewall spacers for the patterned mandrel layer 145. Pulling the mandrel layer 145 from the structure 900 of FIG. 9 results in the intermediate structure 1000 shown in FIG. 10. The remaining spacer material 155 acts as a pattern to etch the hard mask layer 115 and SSOI wafer 100 in the nFET region 102 and the hard mask layer 115, SiGe layer 140, and substrate 130 in the pFET region 101, resulting in the structure 1100 shown in FIG. 11. The etching is accomplished by an RIE process and results in the Si fins 1110 and SiGe fins 1120 shown in FIG. 11.

Figure 11:
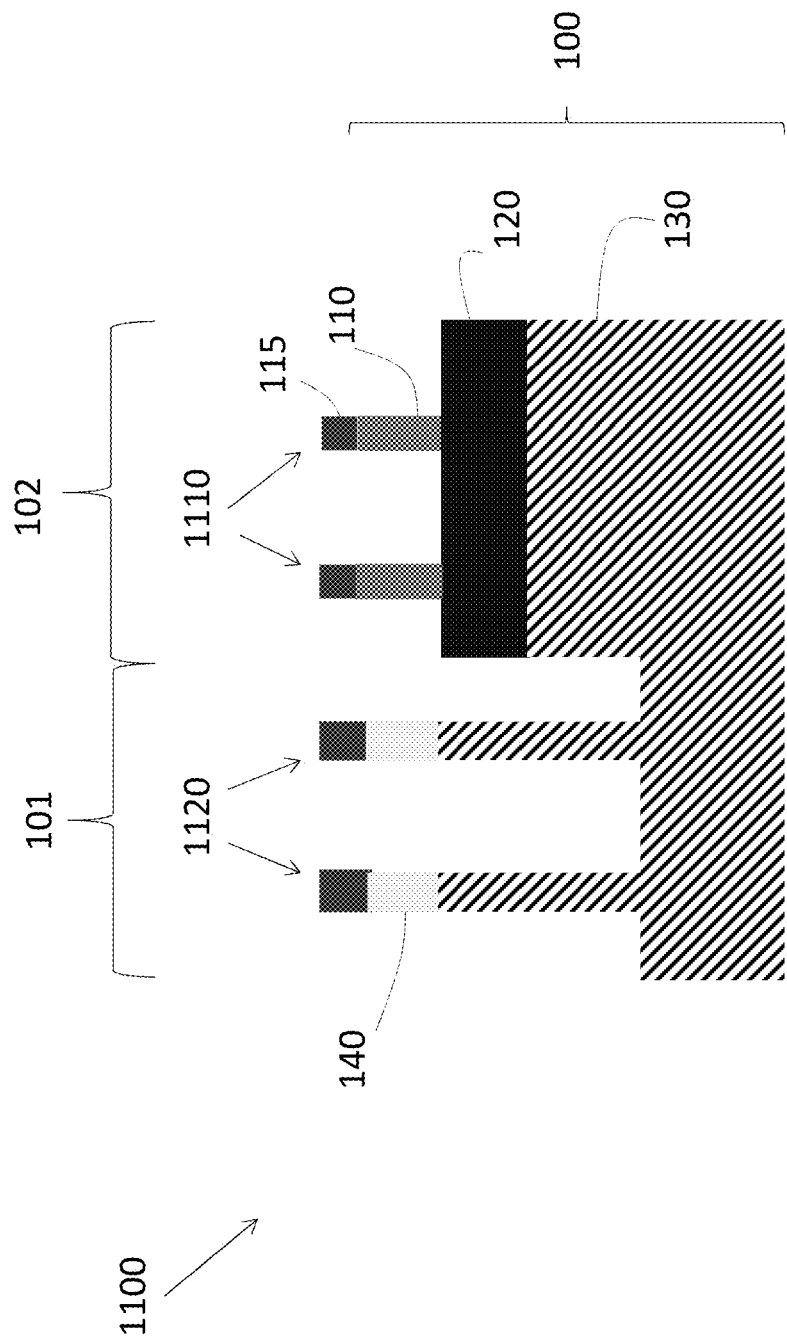
Figure 12:
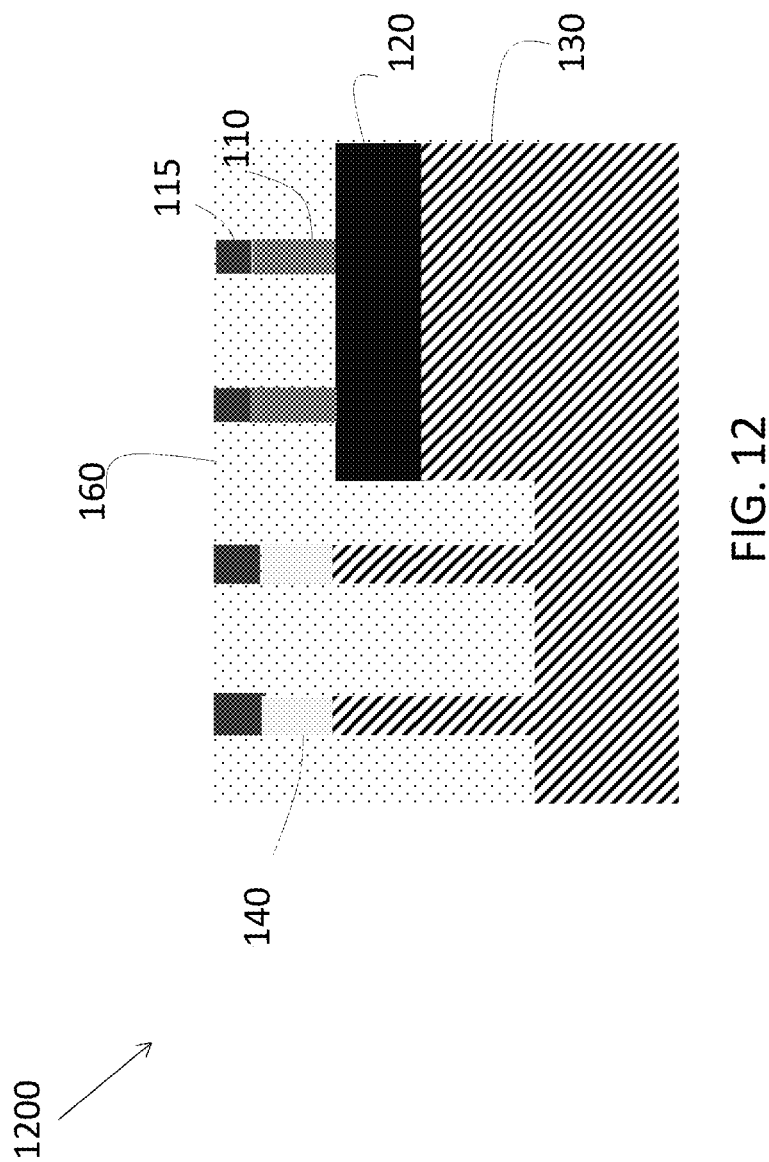
Figure 13:
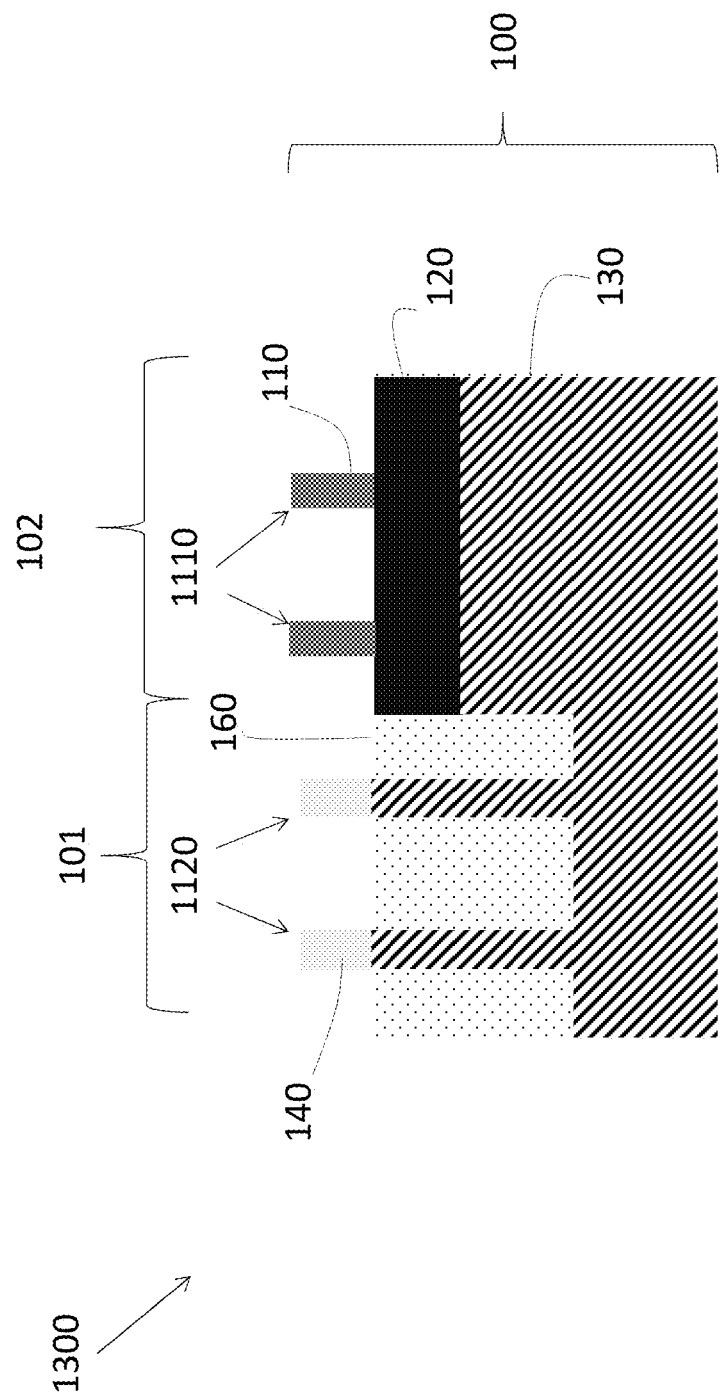

As FIG. 11 indicates, the Si fins 1110 include the strained silicon layer 110 (the SSOI wafer 100) while the SiGe fins 1120 do not include any of the strained silicon layer 110. Also, the Si fins 1110 are formed on an insulator 120 layer while the SiGe fins 1120 are formed on silicon fins grown from the substrate 130. As a result, the Si fins 1110 are isolated from each other but the SiGe fins 1120 are not isolated from each other. This is because, in the nFET region 102, the insulator 120 (e.g., BOX) acts as a stop for the metal gate that will be formed. In the pFET region 101, the high dielectric constant (high k) dielectric on which the metal gate is formed can go down to the substrate 130. FIG. 12 shows the intermediate structure 1200 that results from a shallow trench isolation (STI) 160 fill and chemical mechanical planarization (CMP) process. The STI 160 is etched back and the hard mask layer 115 is stripped to result in the structure 1300 shown in FIG. 13. The fin reveal process to strip the hard mask layer 115 may include using a hot phosphoric acid ($H_3PO_4$) (e.g., 160 degrees Celsius) and controlling the etch rate and etch time to selectively etch the hard mask layer 115 and reveal the Si and SiGe fins 1110, 1120. The STI 160 isolates the SiGe fins 1120 in the pFET region 101. As a result the CMOS that is ultimately fabricated based on additional processes will include dual isolation (isolation between the pFET region 101 and nFET region 102 and isolation among the fins 1110, 1120 with each region 102, 101).

FIGS. 14-22 illustrate the processes involved in forming Si fins from (tensile) strained silicon on an insulator in the nFET region and forming SiGe fins on Si in the pFET region according to another embodiment. The embodiment addressed by FIGS. 14-22 involves a thicker insulator layer within the SSOI such that the Si fins in the nFET region are formed on fins formed from the insulator layer that extend above the insulator layer. That is, the fin etch does not completely extend through the entire thickness of the insulator layer such that the insulator layer is part of the fin structure as well as being a base of the fin structure in the nFET region. Generally, an insulator (e.g., BOX) with a thickness of 100 nanometers (nm) or less (e.g., 20 nm) may be considered "thin" while a thicker insulator (e.g., 140 nm to 200 nm) may be considered "thick." FIGS. 1-13 are directed to an embodiment with a "thin" insulator while FIGS. 14-22 are directed to an embodiment with a "thick" insulator.

Figure 14:
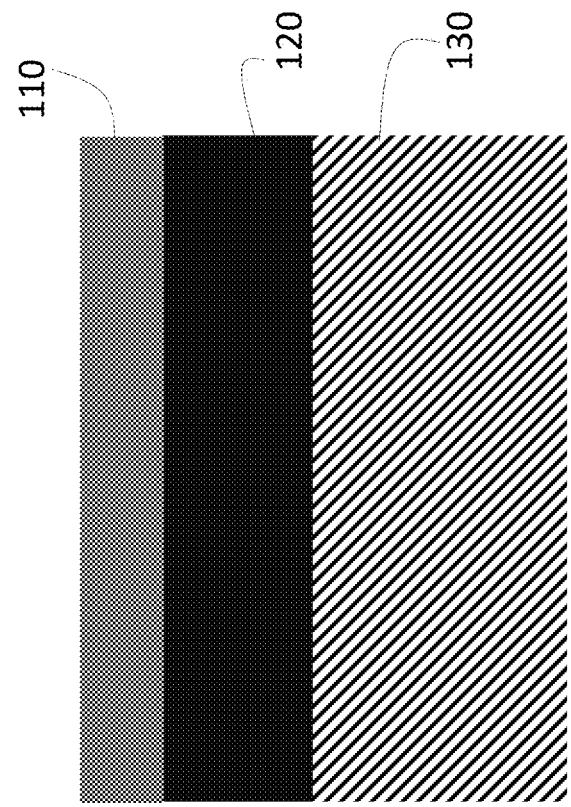

FIG. 14 shows an SSOI wafer 1400. Like the SSOI wafer 100 shown in FIG. 1, the SSOI wafer 1400 of FIG. 14 includes a strained silicon layer 110 on an insulator 120 which is disposed on a bulk substrate 130. The insulator 120 of the SSOI wafer 1400 shown in FIG. 14 is thicker than the insulator 120 of the SSOI wafer 100 shown in FIG. 1. This leads to a difference in the resulting Si fins 2010, as discussed with reference to FIG. 20 below.

Figure 15:
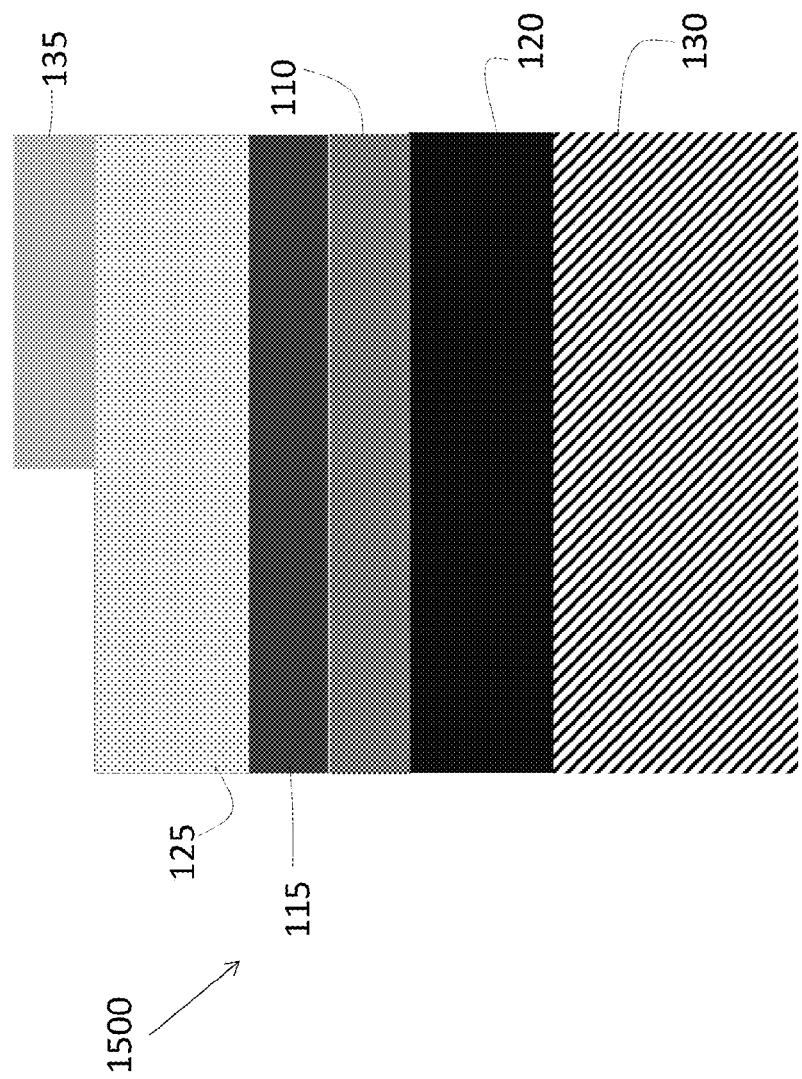
Figure 16:
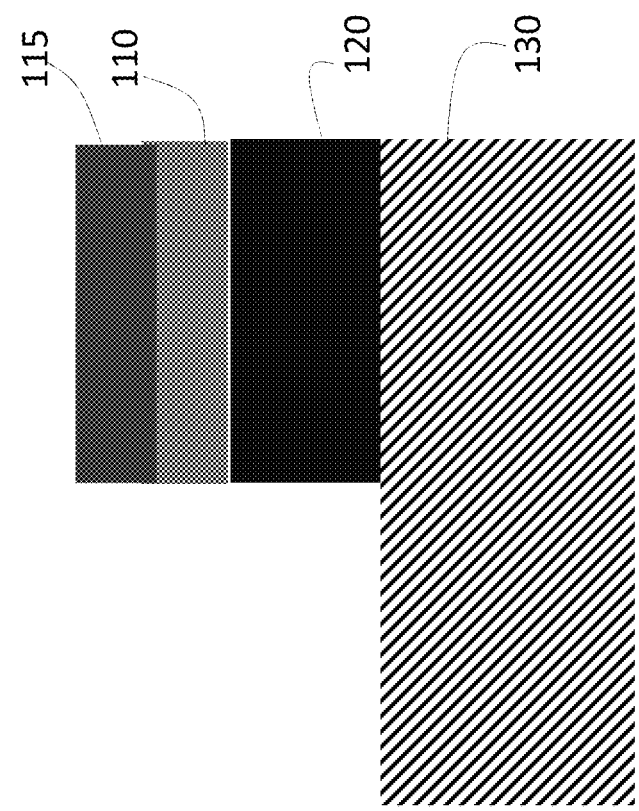
Figure 17:
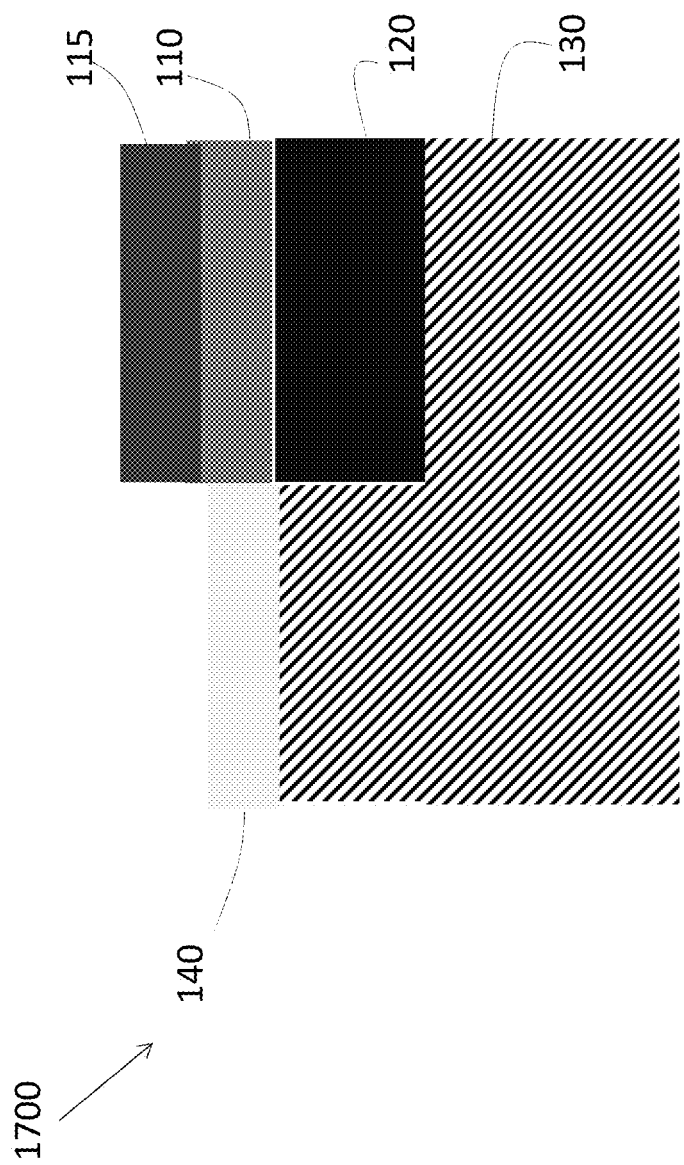
Figure 18:
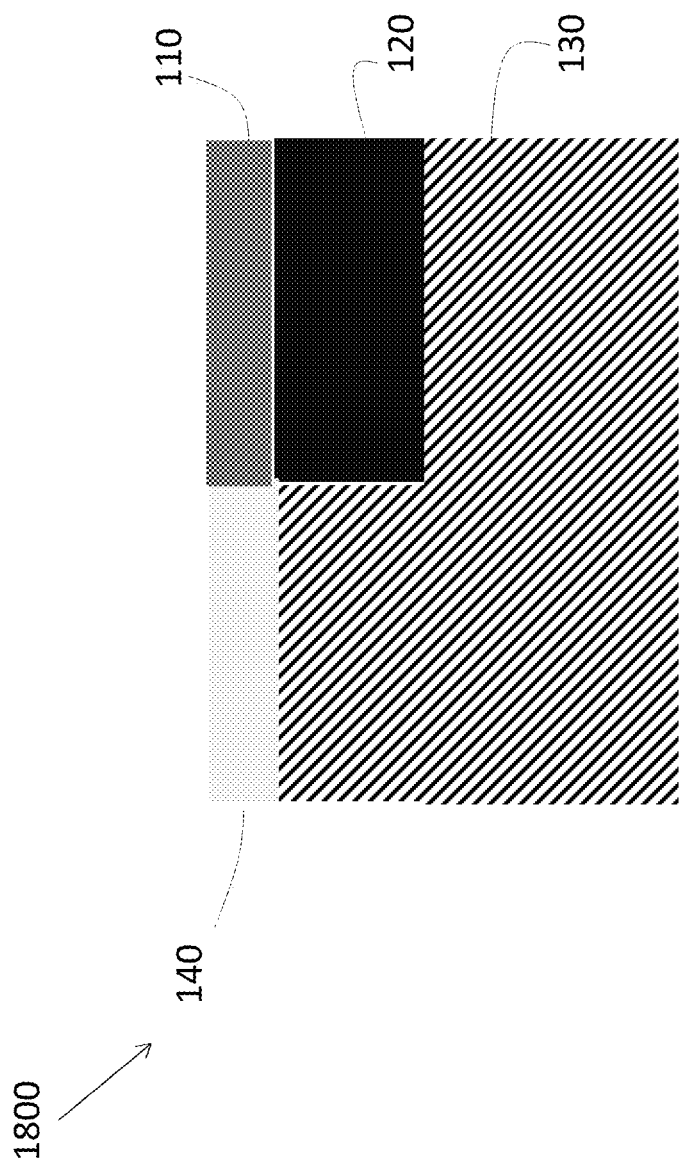
Figure 19:
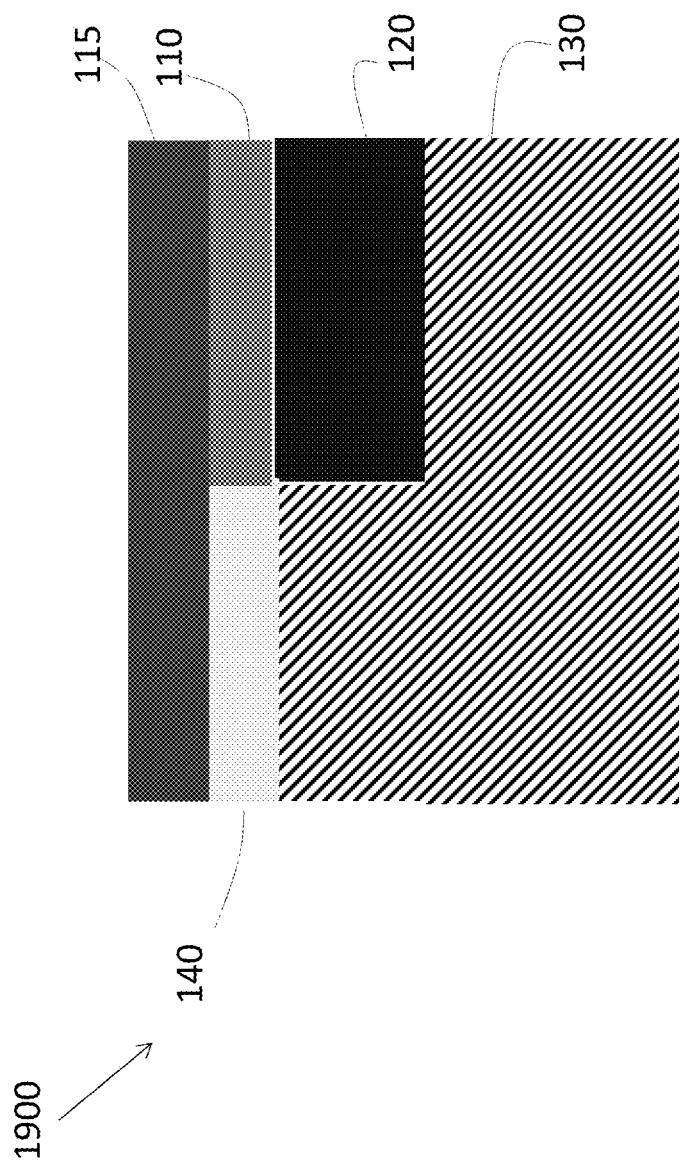

FIG. 15 shows the intermediate structure 1500 that results from deposition of the hard mask layer 115 on the strained silicon layer 110 of the SSOI wafer 100 followed by deposition of the under layer 125 and the patterned photoresist layer 135. As noted with reference to FIG. 2, the patterned photoresist layer 135 covers the under layer 125 in the nFET region 102 but not in the pFET region 101. Performing an etch to remove all the layers in the pFET region 101, including a portion of the substrate 130, results in the structure 1600 shown in FIG. 16. The photoresist layer 135 prevents etching of the layers in the nFET region 102. FIG. 17 shows the structure 1700 resulting from epitaxial growth of silicon from the substrate 130 followed by epitaxial growth of an SiGe layer 140 (which may alternately be additional Si) in the pFET region 101. As noted with reference to FIG. 4 above, the epitaxial growth may be controlled such that the Si grows to about the height of the insulator 120 and the SiGe layer 140 (or additional Si) height is about that of the strained silicon layer 110 in the nFET region 102. FIG. 18 shows the structure 1800 resulting from stripping the hard mask layer 115 from the nFET region 102. FIG. 19 shows the structure 1900 resulting from deposition of the hard mask layer 115 over both the pFET region 101 and the nFET region 102.

Figure 20:
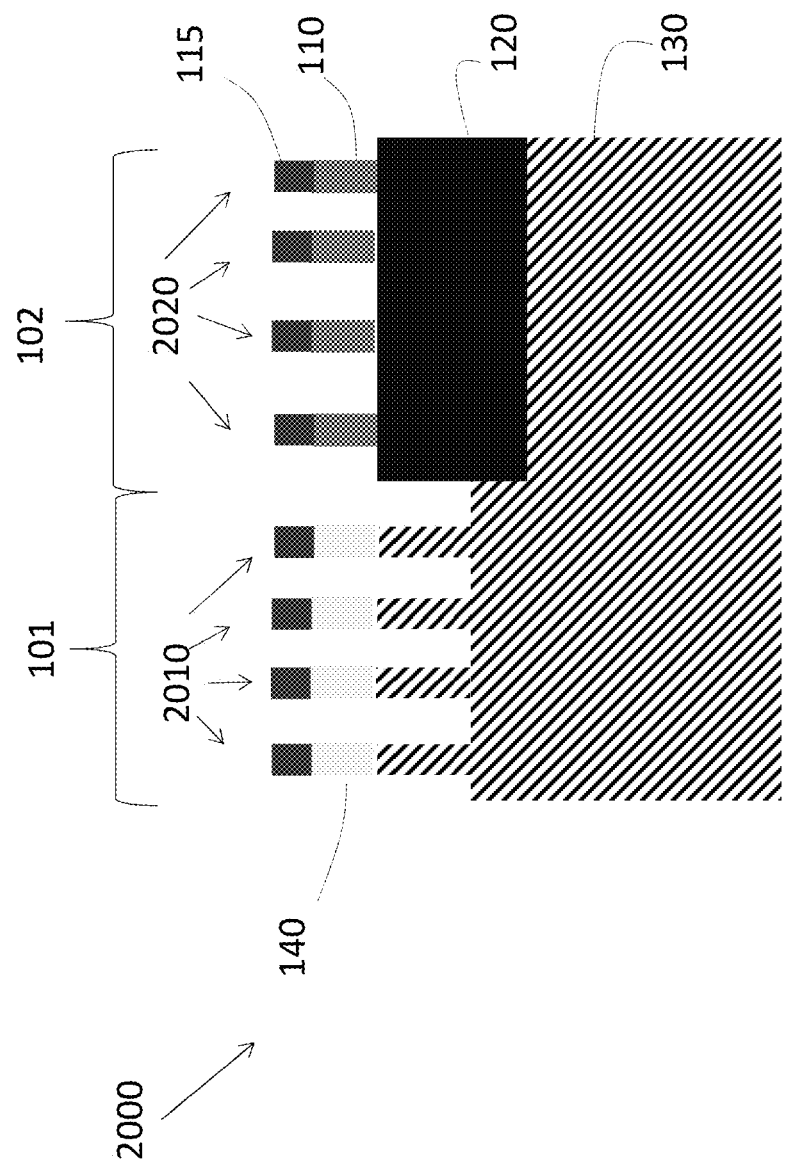
Figure 21:
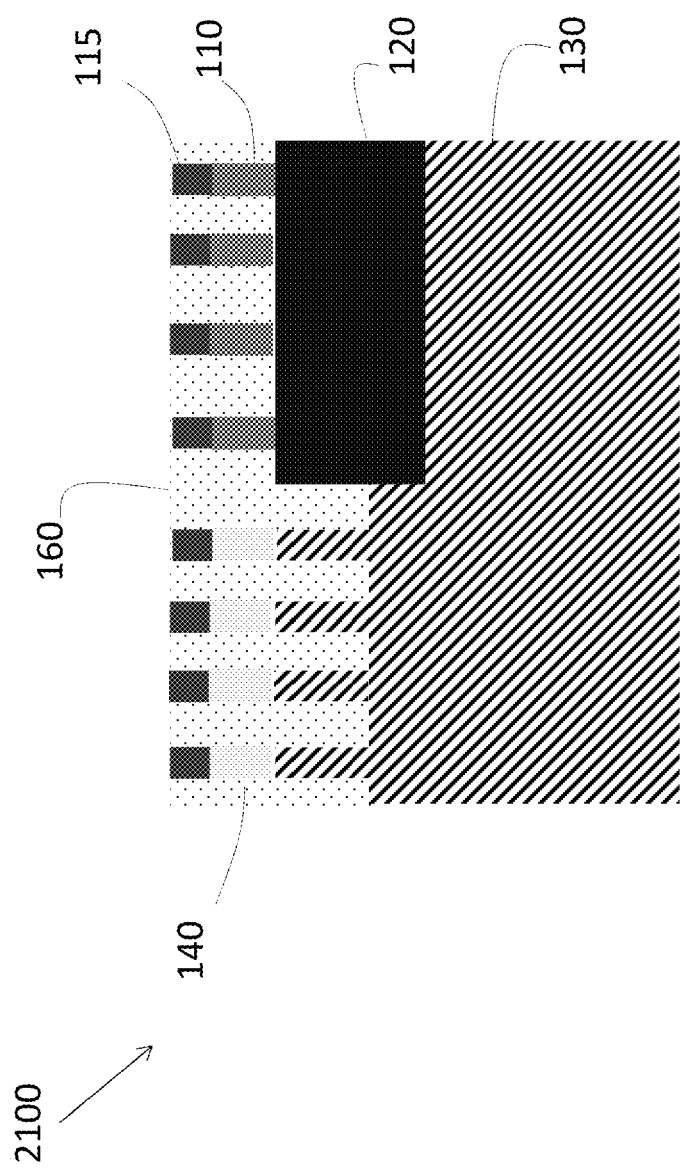
Figure 22:
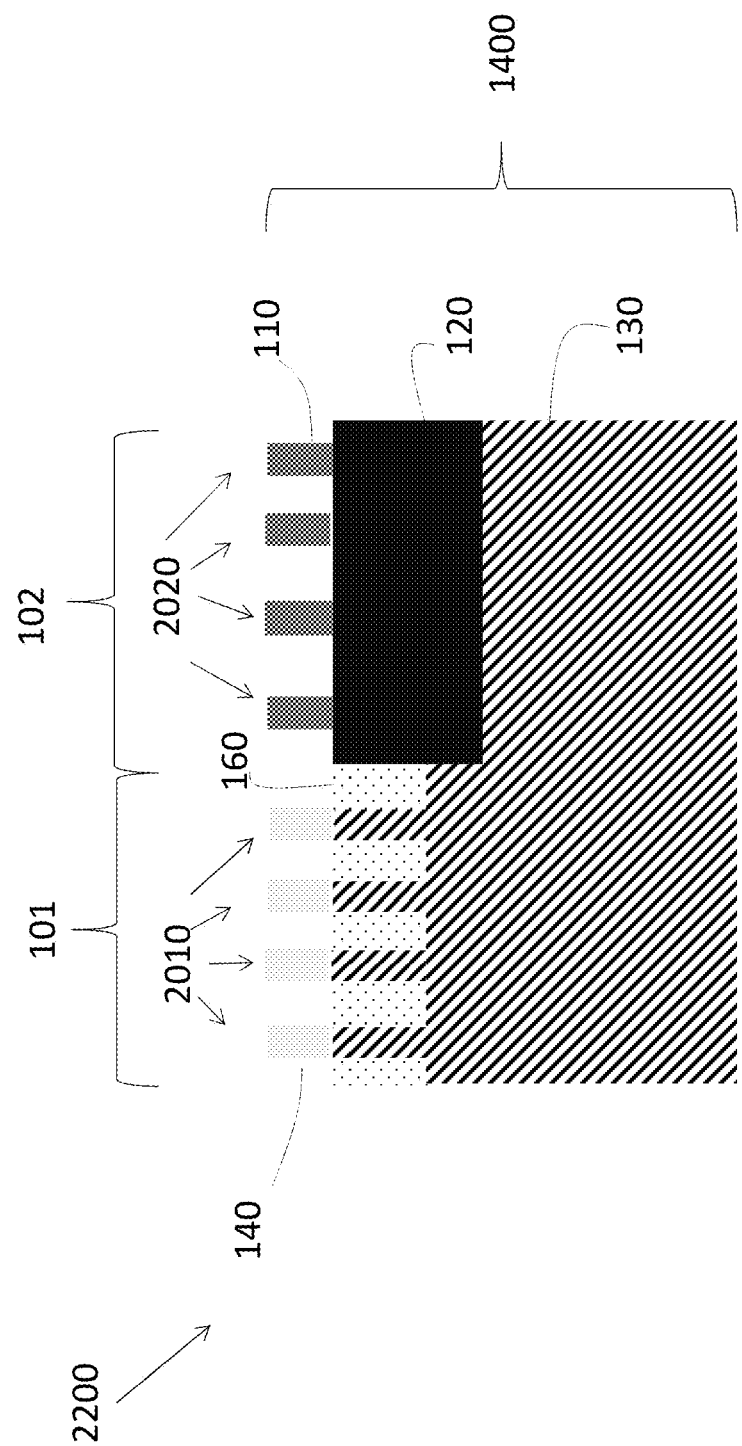

A fin etch process similar to that shown and discussed with reference to FIG. 7-11 is performed to obtain the structure 2000 shown in FIG. 20. FIG. 20 indicates four fins 2010, 2020 in each of the pFET and nFET regions 101, 102. The number of fins may be one or any number and is determined by the number of spacers used to pattern the fins (see e.g., FIG. 10). A comparison of FIG. 11 to FIG. 20 indicates the additional thickness of the insulator 120 layer according to the embodiment shown in FIGS. 14-22. An STI 160 fill followed by a CMP process is once again performed to provide the structure 2100 shown in FIG. 21, and the STI 160 is etched back and the hard mask layer 115 is stripped (e.g., using a hot phosphorous solution as discussed with reference to FIG. 13) in a fin reveal process to provide the structure 2200 shown in FIG. 22. At this stage, known processes are performed to complete the fabrication of the CMOS. Like the embodiment discussed with reference to FIGS. 1-13, the present embodiment results in fins 2020 in the pFET region 101 that do not include the strained silicon layer 110, while the fins 2010 in the nFET region 102 include the strained silicon layer 110 and SSOI wafer 1400. Also, based on the STI 160 fill, dual isolation is obtained among and within the pFET and nFET regions 101, 102.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A complimentary-metal-oxide-semiconductor (CMOS) device with dual isolation, the device comprising:
    an n-type field effect transistor (nFET) region, the nFET region including one or more fins comprised of strained silicon, the one or fins in the nFET region being formed on an insulator; and
    a p-type field effect transistor (pFET) region, the pFET region including one or more fins comprised of silicon (Si) or silicon germanium (SiGe) on epitaxially grown silicon and including a shallow trench isolation (STI) fill to isolate the one or more fins of the pFET region from each other.

2. The device according to claim 1, wherein the epitaxially grown silicon is grown from a bulk substrate.

3. The device according to claim 2, wherein the Si is additional epitaxially grown silicon.

4. The device according to claim 3, wherein the additional epitaxially grown silicon is grown in the pFET region to a same height as the strained silicon in the nFET region.

5. The device according to claim 1, wherein the epitaxially grown silicon is grown in the pFET region to a height at or below that of the insulator in the nFET region.

6. The device according to claim 1, wherein the SiGe is epitaxially grown SiGe.

7. The device according to claim 6, wherein the SiGe is epitaxially grown in the pFET region to a same height as the strained silicon in the nFET region.

8. The device according to claim 1, wherein the STI fill is planarized by a chemical mechanical planarization (CMP) process.

9. The device according to claim 1, wherein the insulator that the one or more fins in the nFET region are disposed on is buried oxide.

10. The device according to claim 1, further comprising a bulk substrate on which the insulator that the one or more fins in the nFET region are disposed on is formed.

11. The device according to claim 1, wherein the epitaxially grown silicon below the one or more fins in the pFET region is formed as fins.

12. The device according to claim 11, wherein the STI fill separates the epitaxially grown silicon formed as fins.

13. The device according to claim 1, wherein a thickness of the insulator in the nFET region is greater than a thickness of the epitaxially grown silicon in the pFET region.

14. The device according to claim 13, wherein the thickness of the insulator in the nFET region is greater than 140 nanometers.

15. The device according to claim 1, wherein a thickness of the insulator in the nFET region is less than a thickness of the epitaxially grown silicon in the pFET region.

16. The device according to claim 15, wherein the thickness of the insulator in the nFET region is less than 100 nanometers.

* * * * *